United States Patent
Hata et al.

(10) Patent No.: US 9,184,240 B2
(45) Date of Patent: Nov. 10, 2015

(54) METHOD OF PRODUCING SEMICONDUCTOR WAFER, AND SEMICONDUCTOR WAFER

(71) Applicants: SUMITOMO CHEMICAL COMPANY, LIMITED, Chuo-ku, Tokyo (JP); NATIONAL INSTITUTE OF ADVANCED INDUSTRIAL SCIENCE AND TECHNOLOGY, Chiyoda-ku, Tokyo (JP)

(72) Inventors: Masahiko Hata, Tsukuba (JP); Osamu Ichikawa, Tsukuba (JP); Yuji Urabe, Tsukuba (JP); Noriyuki Miyata, Tsukuba (JP); Tatsuro Maeda, Tsukuba (JP); Tetsuji Yasuda, Tsukuba (JP)

(73) Assignees: SUMITOMO CHEMICAL COMPANY, LIMITED, Tokyo (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 14/099,425

(22) Filed: Dec. 6, 2013

(65) Prior Publication Data
US 2014/0091433 A1    Apr. 3, 2014

Related U.S. Application Data

(63) Continuation-in-part of application No. PCT/JP2012/003768, filed on Jun. 8, 2012.

(30) Foreign Application Priority Data

Jun. 10, 2011 (JP) .................................. 2011-130726

(51) Int. Cl.
*H01L 21/02* (2006.01)
*H01L 29/20* (2006.01)
(Continued)

(52) U.S. Cl.
CPC ............ *H01L 29/20* (2013.01); *H01L 21/0206* (2013.01); *H01L 21/02178* (2013.01);
(Continued)

(58) Field of Classification Search
CPC ..................... H01L 21/2003; H01L 21/02694; H01L 21/31; H01L 21/0206; H01L 21/28264; H01L 21/02392; H01L 29/66522; H01L 29/20
USPC .......................... 438/493, 483, 509; 257/615
See application file for complete search history.

(56) References Cited

U.S. PATENT DOCUMENTS 3,915,765 A * 10/1975 Cho et al. ....................... 438/379
5,616,947 A *  4/1997 Tamura ......................... 257/410
(Continued)

FOREIGN PATENT DOCUMENTS

JP    2004-342733    * 12/2004    ............ H01L 29/737
JP    2004-342733 A1   12/2004

OTHER PUBLICATIONS

V.N.Besselov, et al, "Chalcogenide passivation of III-V semiconductor surfaces", Semiconductors, vol. 32, No. 11 (Nov. 1998) pp. 1141-1156.*

(Continued)

*Primary Examiner* — Caridad Everhart
(74) *Attorney, Agent, or Firm* — Sughrue Mion, PLLC

(57) ABSTRACT

There is provided a method of producing a semiconductor wafer, including: forming a compound semiconductor layer on a base wafer by epitaxial growth; cleansing a surface of the compound semiconductor layer by means of a cleansing agent containing a selenium compound; and forming an insulating layer on the surface of the compound semiconductor layer. Examples of the selenium compound include a selenium oxide. Examples of the selenium oxide include $H_2SeO_3$. The cleansing agent may further contain one or more substances selected from the group consisting of water, ammonium, and ethanol. When the surface of the compound semiconductor layer is made of $In_xGa_{1-x}As$ ($0 \leq x \leq 1$), the insulating layer is preferably made of $Al_2O_3$, and $Al_2O_3$ is preferably formed by ALD.

8 Claims, 12 Drawing Sheets

(51) Int. Cl.
  *H01L 21/28* (2006.01)
  *H01L 29/51* (2006.01)
  *H01L 29/66* (2006.01)

(52) U.S. Cl.
  CPC .... *H01L21/02546* (2013.01); *H01L 21/28264* (2013.01); *H01L 29/517* (2013.01); *H01L 29/66522* (2013.01); *H01L 21/0237* (2013.01); *H01L 21/0262* (2013.01); *H01L 21/02392* (2013.01); *H01L 21/02664* (2013.01)

(56) References Cited

U.S. PATENT DOCUMENTS

| | | | |
|---|---|---|---|
| 2010/0261304 A1* | 10/2010 | Chang et al. | 438/72 |
| 2011/0012178 A1 | 1/2011 | Sugiyama et al. | |
| 2011/0089469 A1 | 4/2011 | Merckling | |
| 2013/0043508 A1* | 2/2013 | Merckling | 257/201 |

OTHER PUBLICATIONS

Machine translation of Shinoda, et al , JP 2004-342733 (Dec. 2, 2004) 30 pages.*

Y. Xuan et al., Submicrometer Inversion-Type Enhancement-Mode InGaAs MOSFET With Atomic-Layer-Deposited $Al_2O_3$ as Gate Dielectric, IEEE Electron Device Letters., (2007), pp. 935-938, vol. 28, No. 11.

Wu et al., High Performance Deep-Submicron Inversion-Mode InGaAs MOSFETs with maximum $G_m$ exceeding 1.1 mS/μm: New HBr Pretreatment and Channel Engineering, IEDM Tech. Dig., (2009), pp. 323-326.

H. J. Oh, Thermally Robust Phosphorous Nitride Interface Passivation for InGaAs Self-Aligned Gate-First n-MOSFET Integrated with High-k Dielectric, IEDM Tech. Dig., 2009, pp. 339-342.

Urabe, Improved Electron Mobility and On/Off Ratio of InGaAs MISFETs by New Surface Treatments Utilizing Selenite Adsorption, 42nd IEEE Semiconductor Interface Specialists Conference, SISC2011 6.5.

International Preliminary Report on Patentability and Written Opinion issued Jul. 3, 2012 in International Application No. PCT/JP2012/003768.

Japanese Office Action issued in counterpart JP Application No. 2011-130726, dated Jun. 2, 2015.

Communication dated Aug. 26, 2015 from the State Intellectual Property Office of the People's Republic of China in counterpart Application No. 201280024373.1.

* cited by examiner

METHOD OF PRODUCING SEMICONDUCTOR WAFER, AND SEMICONDUCTOR WAFER

TECHNICAL FIELD

The present invention relates to a method of producing a semiconductor wafer, and a semiconductor wafer.

BACKGROUND ART

Non-patent Documents 1 to 3 disclose passivation techniques to passivate a surface of a Group III-V compound semiconductor to be used in an MISFET (Metal-Insulator-Semiconductor Field-Effect Transistor) by using $(NH_4)_2S$, HBr or phosphorous nitride.

Non-patent Document 1: Y. Xuan et al., IEEE Electron Device Lett., 28, 935 (2007)

Non-patent Document 2: Y. Q. Wu et al., IEDM Tech. Dig., 323 (2009)

Non-patent Document 3: H. J. Oh et al., IEDM Tech. Dig., 339 (2009)

SUMMARY OF THE INVENTION

Problems to be Solved by the Invention

The passivation techniques are expected to reduce the density of defects in an interface between a Group III-V compound semiconductor and an insulating layer, and improve the performance of a Group III-V MISFET in which a Group III-V compound semiconductor layer is used as a channel layer.

However, a passivation technique to more effectively passivate a surface of a Group III-V compound semiconductor is desired. The performance of a Group III-V MISFET is expected to be improved by employing such a more effective passivation technique.

An object of the present invention is to provide a more effective passivation technique to passivate a surface of a Group III-V compound semiconductor that realizes a higher performance Group III-V MISFET.

Means for Solving the Problems

In order to solve the problems, a first aspect of the present invention provides a method for producing a semiconductor wafer, the method including: forming a compound semiconductor layer on a base wafer by epitaxial growth; cleansing a surface of the compound semiconductor layer by means of a cleansing agent containing a selenium compound; and forming an insulating layer on the surface of the compound semiconductor layer.

Examples of the selenium compound include a selenium oxide. Examples of the selenium oxide include $H_2SeO_3$. The cleansing agent may further contain one or more substances selected from the group consisting of water, ammonium, and ethanol. The molar concentration of the selenium compound in the cleansing agent preferably falls within the range of $7\times10^{-3}$ mol/l to $7\times10^{-1}$ mol/l. When the surface of the compound semiconductor layer is made of $In_xGa_{1-x}As$ ($0\le x\le 1$), the insulating layer is preferably made of $Al_2O_3$. Examples of forming the insulating layer include forming the insulating layer by ALD (atomic layer deposition).

A second aspect of the present invention provides a semiconductor wafer including: a compound semiconductor layer; and an insulating layer that is in contact with the compound semiconductor layer, wherein selenium atoms are contained in an interface between the compound semiconductor layer and the insulating layer. The surface density of the selenium atoms in the interface between the compound semiconductor layer and the insulating layer is preferably equal to or less than $1\times10^{14}$ atoms/cm$^2$. When the surface of the compound semiconductor layer is made of $In_xGa_{1-x}As$ ($0\le x\le 1$), the insulating layer is preferably made of $Al_2O_3$.

MODE FOR CARRYING OUT THE INVENTION

Figure 1:
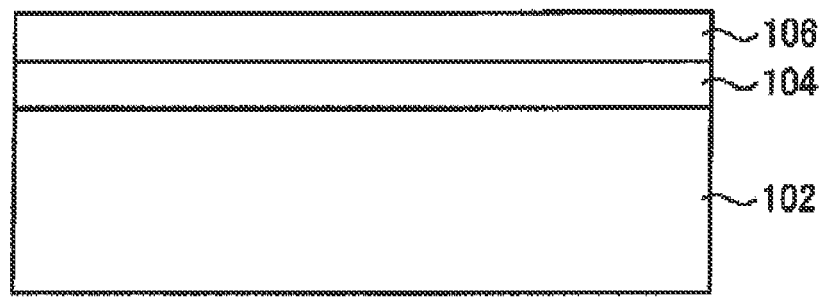
FIG. 1 shows a cross-section of a semiconductor wafer 100.

FIG. 1 shows a cross-section of a semiconductor wafer 100. The semiconductor wafer 100 has a base wafer 102, a compound semiconductor layer 104 and an insulating layer 106. The base wafer 102, the compound semiconductor layer 104 and the insulating layer 106 are positioned in this order.

Examples of the base wafer 102 include an InP wafer. Examples of the InP wafer include an InP (100) wafer in which the compound semiconductor layer 104 will be formed on a (100) surface, and an InP (111) A wafer in which the compound semiconductor layer 104 will be formed on a (111) A surface. The base wafer 102 may be a wafer whose surface is made of a silicon crystal, Examples of the wafer whose surface is made of a silicon crystal include a silicon wafer and a SOI (Silicon on Insulator) wafer. The base wafer 102 may be an insulator wafer made of glass, ceramics and the like, a conductor wafer made of metal and the like, or a semiconductor wafer made of silicon carbide and the like.

The compound semiconductor layer 104 is formed on the base wafer 102 by epitaxial growth. Examples of the compound semiconductor layer 104 include a Group III-V compound semiconductor layer. By using the compound semiconductor layer 104 made of a Group III-V compound semiconductor, a high-performance MISFET having high mobility can be formed. Examples of the compound semiconductor layer 104 include $In_xGa_{1-x}As$ ($0 \leq x \leq 1$).

The insulating layer 106 is formed to be in contact with the compound semiconductor layer 104. The insulating layer 106 serves as a gate insulating layer of a MISFET, and examples of the insulating layer 106 include an $Al_2O_3$ layer formed for example by ALD. Note that, when a surface of the compound semiconductor layer 104 is made of $In_xGa_{1-x}As$ ($0 \leq x \leq 1$), the insulating layer 106 is preferably made of $Al_2O_3$. When the compound semiconductor layer 104 has a multilayer structure made of a plurality of compound semiconductor layers, and a surface of the uppermost compound semiconductor layer is made of $In_xGa_{1-x}As$ ($0 \leq x \leq 1$), the insulating layer 106 is preferably made of $Al_2O_3$.

An interface between the compound semiconductor layer 104 and the insulating layer 106 contains selenium atoms. That "an interface contains selenium atoms" not only denotes that selenium atoms are present strictly in the interface, but may denote that selenium atoms are present in the vicinity of the interface. Also, selenium atoms are present mainly on the insulating layer 106 side of the interface. For example, the surface density of selenium atoms contained in the compound semiconductor layer 104 in the vicinity of the interface is lower than the surface density of selenium atoms contained in the insulating layer 106 in the vicinity of the interface. A depth profile analysis for positions of selenium atoms, for example, by SIMS (secondary ion mass spectroscopy) shows that selenium atoms are present in a somewhat wide range from the interface. The surface density of selenium atoms in the interface between the compound semiconductor layer 104 and the insulating layer 106 is preferably equal to or less than $1 \times 10^{14}$ atoms/cm$^2$.

Figure 2:
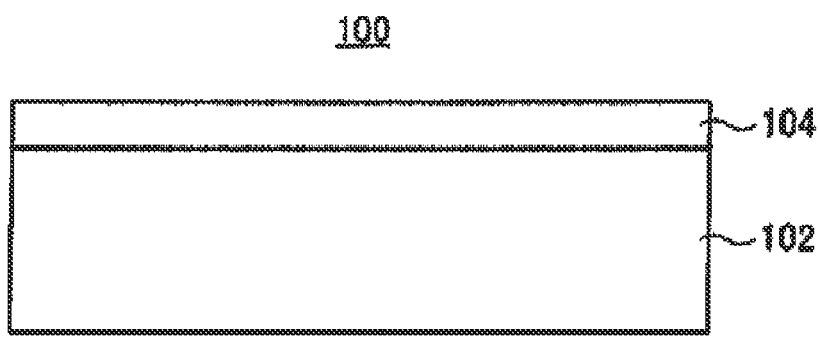
FIG. 2 shows a cross-section during a production process of the semiconductor wafer 100.
Figure 3:
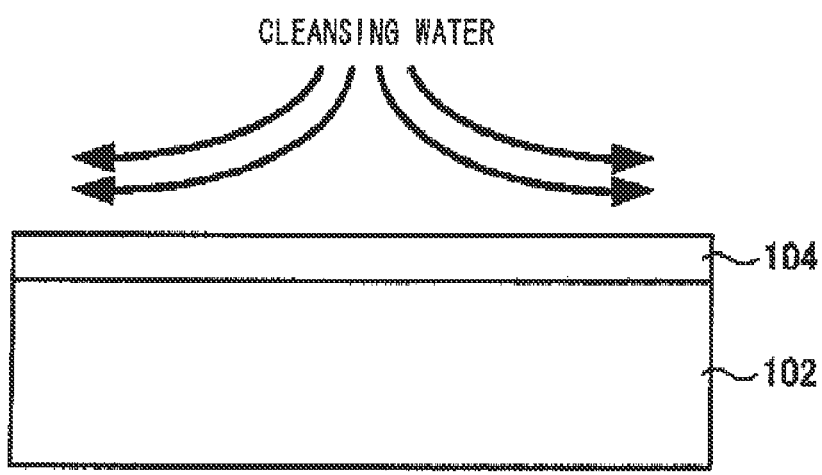
FIG. 3 shows a cross-section during a production process of the semiconductor wafer 100.

FIGS. 2 and 3 show cross-sections during a production process of the semiconductor wafer 100. As shown in FIG. 2, the base wafer 102 is prepared, and the compound semiconductor layer 104 is formed on the base wafer 102 by epitaxial growth. MOCVD (Metal Organic Chemical Vapor Deposition) can be utilized for the epitaxial growth of the compound semiconductor layer 104. In MOCVD, TMIn (trimethylindium) can be used for the In source, TMGa (trimethylgallium) can be used for the Ga source, and $AsH_3$ (arsine) can be used for the As source. Hydrogen can be used as the carrier gas. The reaction temperature can be appropriately selected within the range of 300° C. to 900° C., and preferably within the range of 450° C. to 750° C. The thickness of the epitaxial growth layer can be controlled by appropriately selecting the reaction time.

As shown in FIG. 3, the surface of the compound semiconductor layer 104 is cleansed with a cleansing agent containing a selenium compound. Examples of the selenium compound include a selenium oxide. Examples of the selenium oxide include $H_2SeO_3$. The cleansing agent may further contain one or more substances selected from a group consisting of water, ammonium and ethanol. The molar concentration of the selenium compound in the cleansing agent can fall within the range of $7 \times 10^{-3}$ mol/l to $7 \times 10^{-1}$ mol/l. Then, the insulating layer 106 is formed on the compound semiconductor layer 104, and the semiconductor wafer 100 shown in FIG. 1 can be produced.

Note that when the surface of the compound semiconductor layer 104 is made of $In_xGa_{1-x}As$ ($0 \leq x \leq 1$), the insulating layer 106 is preferably made of $Al_2O_3$. In this case, the insulating layer 106 made of $Al_2O_3$ is preferably formed by ALD. In the forming of the $Al_2O_3$ layer by ALD, only TMA (trimethylaluminum) is introduced as the Al source at the first step of the layer formation. It is assumed that at this step of introducing only TMA, Se atoms that have remained on the surface of the compound semiconductor layer 104 after the preceding cleansing process, and have not bound strongly to the surface are removed. The number of defects formed between the compound semiconductor layer 104 and the insulating layer 106 is expected to resultantly decrease, thereby improving the performance of the FET.

In the above-described production process of the semiconductor wafer 100, because the surface of the compound semiconductor layer 104 is cleansed with the cleansing agent containing the selenium compound, the density of defects in the interface between the compound semiconductor layer 104 and the insulating layer 106 can be lowered, thereby improving the performance of the MISFET.

Figure 4:
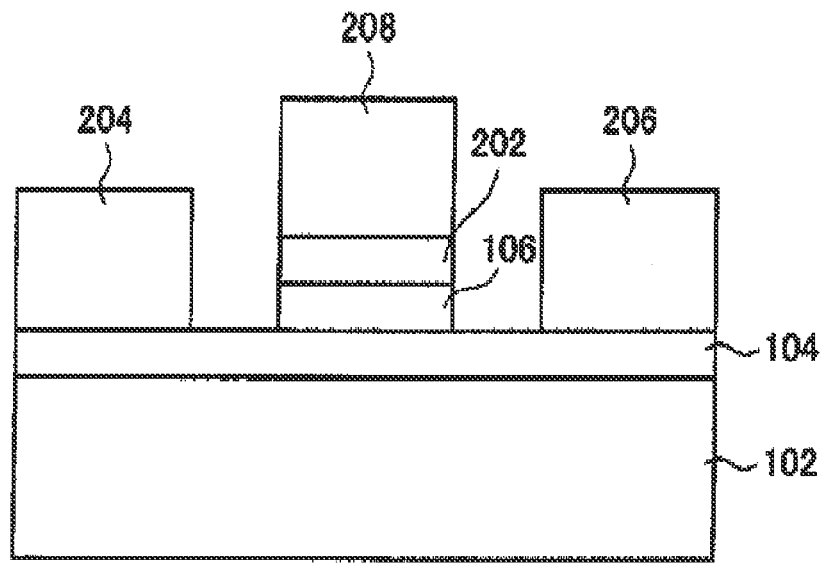
FIG. 4 shows a cross-section of a field-effect transistor 200.
Figure 5:
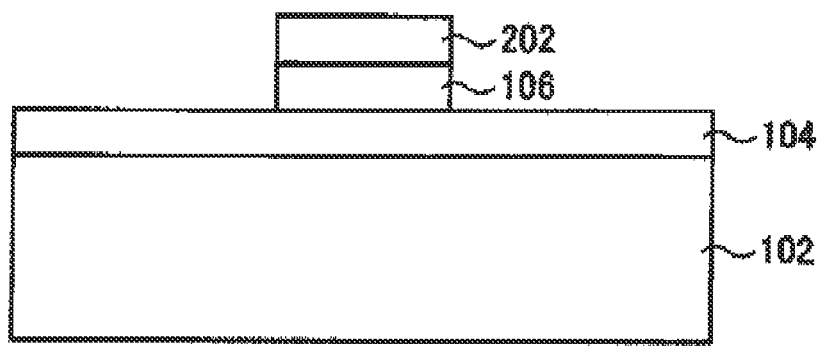
FIG. 5 shows a cross-section during a production process of the field-effect transistor 200.

FIG. 4 shows a cross-section of a field-effect transistor 200, and FIG. 5 shows a cross-section during a production process of the field-effect transistor 200. The field-effect transistor 200 is formed on the surface of the semiconductor wafer 100, and includes a gate electrode 202, a source electrode 204 and a drain electrode 206. The insulating layer 106 is positioned between the compound semiconductor layer 104 of the semiconductor wafer 100 and the gate electrode 202, and the insulating layer 106 serves as a gate insulating layer. A part of the compound semiconductor layer 104 serves as a channel. A gate metal 208 may be formed on the gate electrode 202. Examples of the gate electrode 202 include TaN. The source electrode 204, the drain electrode 206 and the gate metal 208 are, for example, a film stack of Ti/Au.

As shown in FIG. 5 after the semiconductor wafer 100 is produced, the gate electrode 202 is formed by deposition of a TaN film by sputtering and then patterning of the TaN film by lithography. At the same time with the patterning of the TaN film, regions of the insulating layer 106 where the source electrode 204 and the drain electrode 206 are to be formed are etched and removed.

Next, the source electrode 204, the drain electrode 206 and the gate metal 208 are formed simultaneously by, for example, deposition of the Ti/Au film, stack by sputtering, and patterning by lift-off process. In this way, the field-effect transistor 200 can be produced.

Note that, while in this example the field-effect transistor 200 is shown as an example of an electronic device that uses the semiconductor wafer 100, examples of such an electronic device include a capacitor and the like. That is, such an electronic device may have, on a part of the insulating layer 106, an electrode which, together with the compound semiconductor layer 104, serves as an electrode of a parallel plate capacitor, while another part of the insulating layer 106 sandwiched by the electrode and the compound semiconductor layer 104 may serve as a capacitor insulator.

Embodiment Example

A field-effect transistor similar to the above-described field-effect transistor 200 was actually produced, and various types of analysis and performance evaluation were performed. Two types of wafers, an InP (100) wafer and an InP (111) A wafer were used as the base wafer 102. A p-type InGaAs layer was formed as the compound semiconductor layer 104 respectively on the InP wafers by epitaxial growth. The p-type InGaAs layer was 0.5-μm-thick, and the concentration of the p-type impurity atoms was $3 \times 10^{16}$ atoms/cm$^3$. After a 6-nm-thick $Al_2O_3$ protection layer was formed by ALD, Si ions were implanted as the n-type impurity atoms in the source/drain regions. The ion current was adjusted so that the Si ion implantation amount was $2 \times 10^{14}$ atoms/cm$^2$. The impurity atoms were activated by heating under a nitrogen atmosphere at 600° C. for 10 seconds, and the $Al_2O_3$ protection layer was removed by etching with a buffered hydrofluoric acid.

Next, the surface of the p-type InGaAs layer was cleansed. The cleansing was performed by dipping, in a Se cleansing agent, the InP wafers on which the p-type InGaAs layers were formed. A $NH_4OH$ solution containing $H_2SeO_3$ at the concentration of $4 \times 10^{-2}$ mol/l was used as the Se cleansing agent. Note that a sample of Comparative Example 1 was produced by using a sulfur cleansing agent containing $(NH_4)_2S$ instead of $H_2SeO_3$, and a sample of Comparative Example 2 was produced using only a $NH_4OH$ solution.

After the cleansing, an $Al_2O_3$ layer was formed as the insulating layer 106 by ALD. The thickness of the $Al_2O_3$ layer was 12 nm, and the deposition temperature was 250° C. A gate electrode made of TaN was formed by sputtering, and a source/drain electrode made of Ti/Au was formed. Post metal annealing was performed under a nitrogen atmosphere at 350° C. for 90 seconds to produce field effect transistors of Embodiment Example and Comparative Examples. The performance of the produced field-effect transistor of the Embodiment Examples is described while comparing with those of Comparative Examples.

Figure 6:
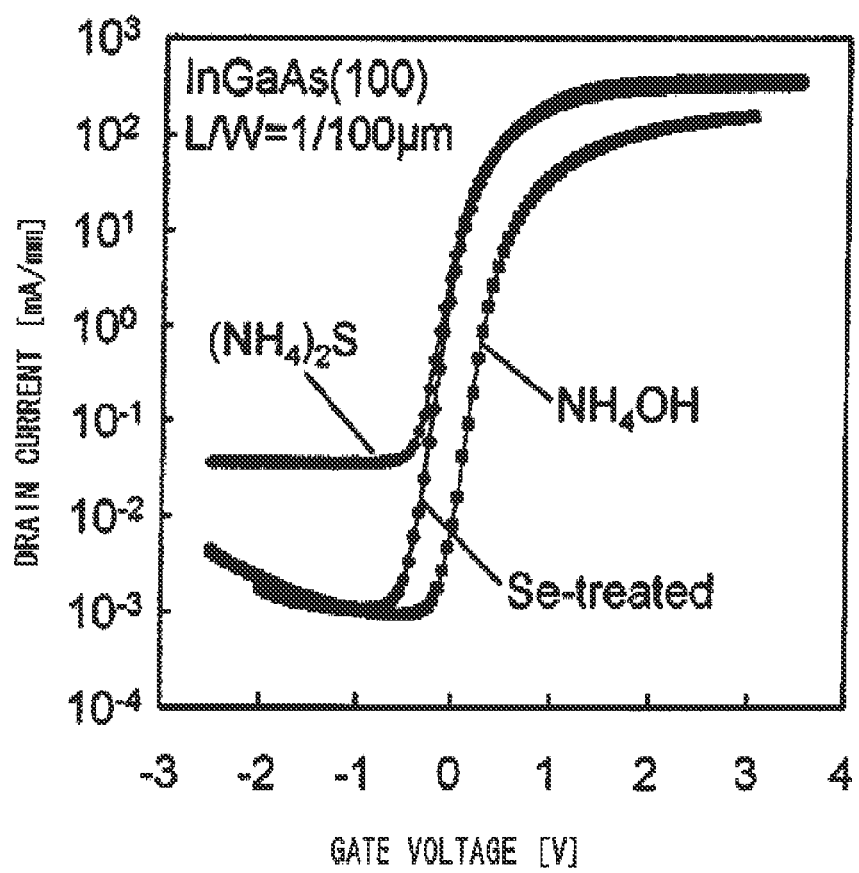
FIG. 6 shows drain current-gate voltage (Id-Vg) characteristics of field-effect transistors produced on InP (100) wafers.
Figure 7:
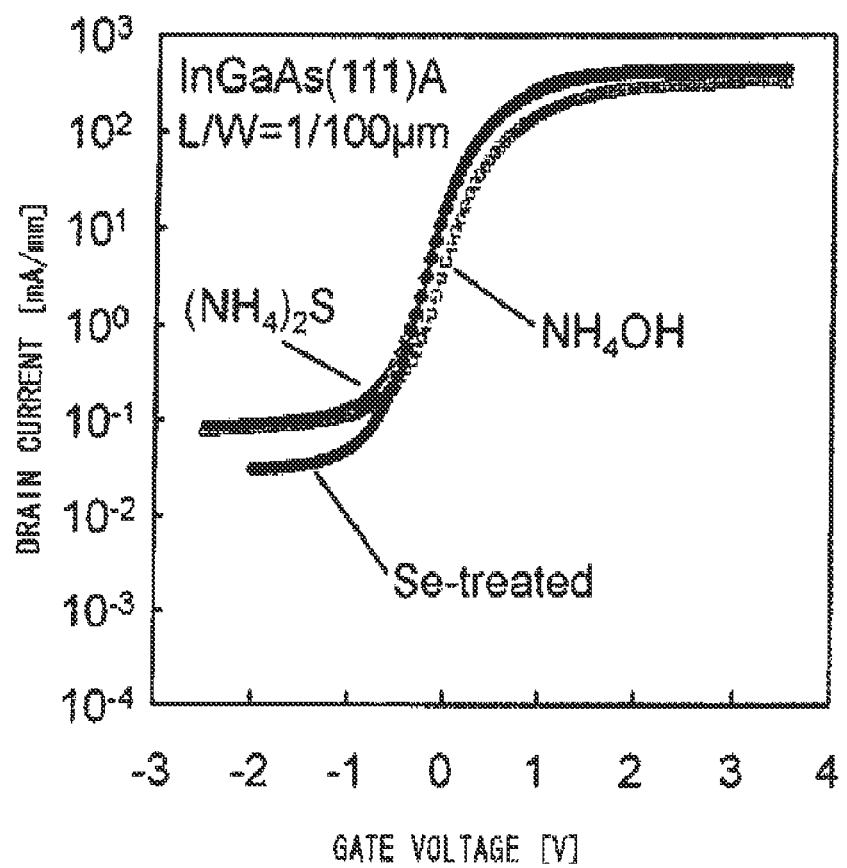
FIG. 7 shows Id-Vg characteristics of field-effect transistors produced on InP (111) A wafers.

FIG. 6 shows drain current-gate voltage (Id-Vg) characteristics of field-effect transistors produced on the InP (100) wafers, and FIG. 7 shows Id-Vg characteristics of field-effect transistors produced on the InP (111) A wafers. Note that, in the cases of FIGS. 6 and 7, the gate length (L) and the gate width (W) of each of the field-effect transistors were 1 μm and 100 μm, respectively. FIGS. 6 and 7 show that remarkably lower OFF-state currents were observed when the Se cleansing agent was used as compared with when the sulfur cleansing agent was used. In particular, the effect to lower an OFF-state current was more significant in the InP (100) wafers.

Figure 8:
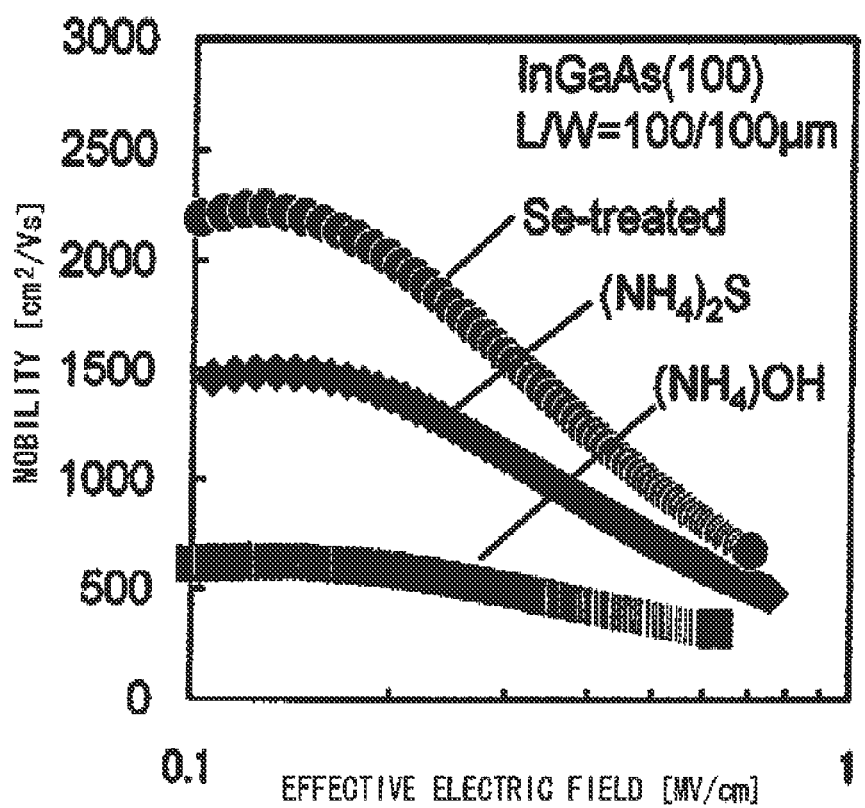
FIG. 8 shows the mobility of field-effect transistors produced on the InP (100) wafers.
Figure 9:
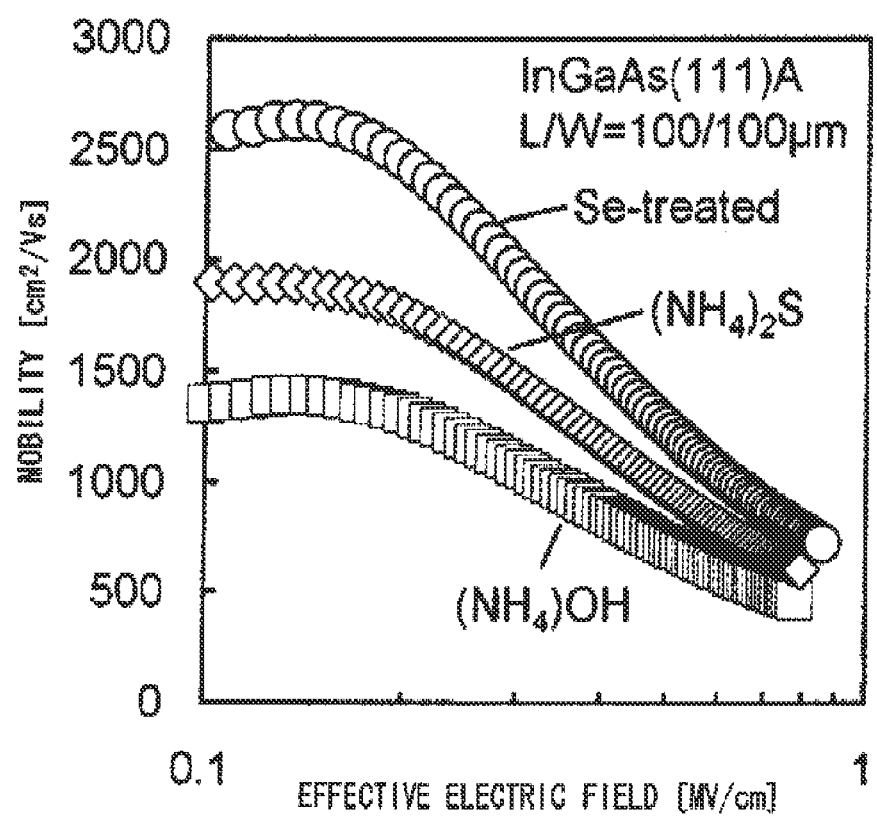
FIG. 9 shows the mobility of field-effect transistors produced on the InP (111) A wafers.

FIG. 8 shows the mobility of field-effect transistors produced on the InP (100) wafers, and FIG. 9 shows the mobility of field-effect transistors produced on the InP (111) A wafers. Note that, in the cases of FIGS. 8 and 9, the gate length and the gate width of each of the field-effect transistors were both 100 μm. FIGS. 8 and 9 show a mobility improving effect obtained by using the sulfur cleansing agent as compared to when the $NH_4OH$ cleansing agent was used. Furthermore, a more significant mobility improving effect was observed when the Se cleansing agent was used as compared to when the sulfur cleansing agent was used. The effective mobility in the field intensity of 0.6 MV/cm when the Se cleansing agent was used was 1034 cm$^2$/Vs for the InP (111) A wafer, and 837 cm$^2$/Vs for the InP (100) wafer. The effective mobility for the InP (111) A wafer was 2.7 times as large as that when the active layer was made of silicon.

Figure 10:
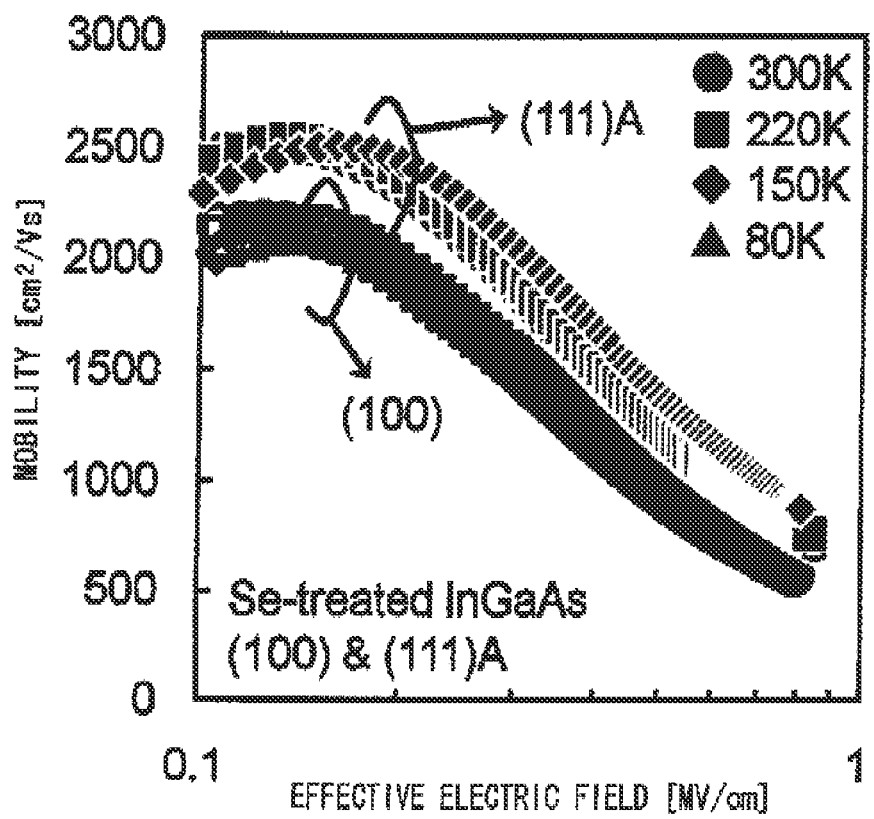
FIG. 10 shows the temperature dependence of the mobility of field-effect transistors produced on the InP (100) wafers and the InP (111) A wafers.
Figure 11:
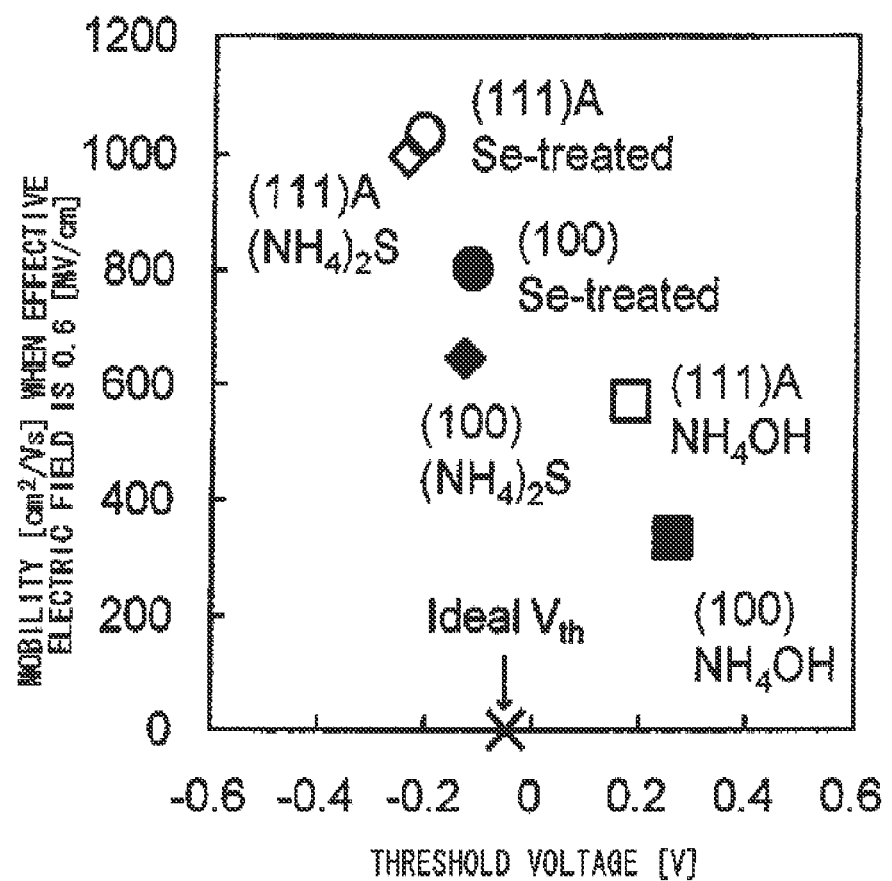
FIG. 11 shows the relationship between the mobility and the threshold voltage of field-effect transistors produced on the InP (100) wafers and the InP (111) A wafers at high electric fields.

FIG. 10 shows the temperature dependence of the mobility of field-effect transistors produced on the InP (100) wafers and the InP (111) A wafers. FIG. 11 shows the relationship between the mobility and the threshold voltage of field-effect transistors produced on the InP (100) wafers and the InP (111) A wafers at high electric fields. As shown in FIG. 10, even when the temperature was changed from 80K to 300K, the mobility of the field-effect transistors changed little for both the InP (100) wafers and the InP (111) A wafers; therefore, the temperature dependence was not so significant. This result is consistent with a knowledge that the present inventors have found that scattering of the carriers that move in the channels attributes mainly to roughness and dipole fluctuation in the interface with the insulating layer. Also, the present inventors have found a knowledge that when a MISFET is constituted using an interface with less dipoles fluctuation, the threshold voltage shifts toward the negative side. FIG. 11 shows that as the threshold voltage shifts toward the negative side, the mobility improves more. The results suggest that the dipole fluctuation which is one form of defects at the MIS interface was suppressed by the cleansing with the Se cleansing agent.

Figure 12:
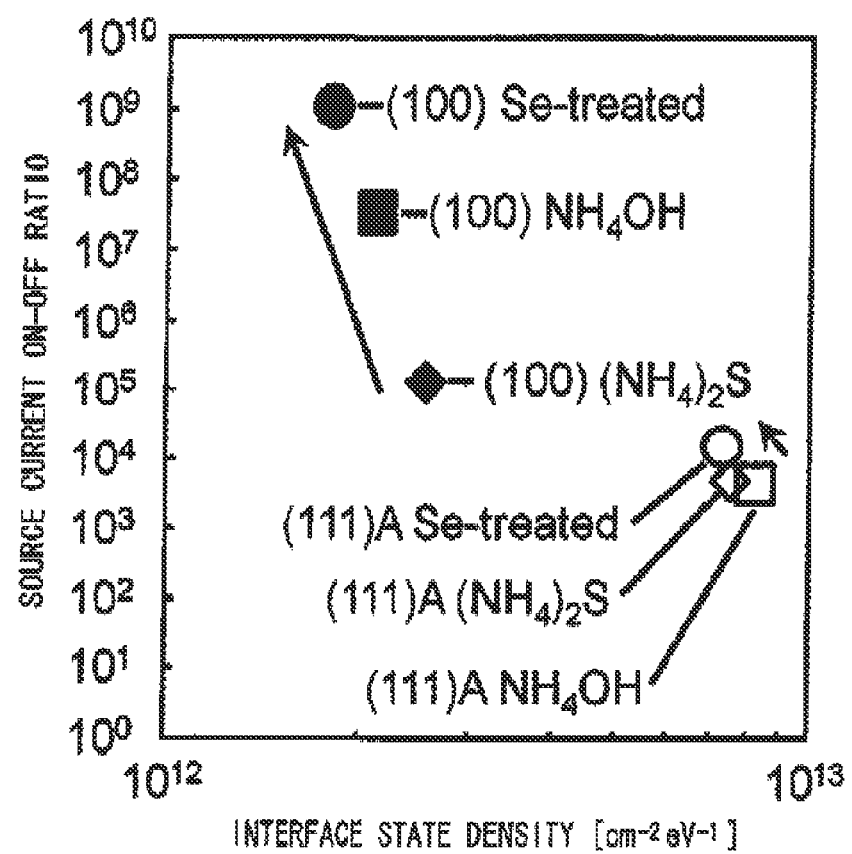
FIG. 12 shows the relationship between the current on-off ratio and the interface state density, estimated from S factors, of field-effect transistors produced on the InP (100) wafers and the InP (111) A wafers.

FIG. 12 shows the relationship between the current on-off ratio and the interface state density, estimated from the S factors, of field-effect transistors produced on the InP (100) wafers and the InP (111) A wafers. Here, the S factor is a rate of changes in the drain current in relation to the gate voltage equal to or less than the threshold voltage, and can be used to calculate the interface state density. As shown in FIG. 12, as the interface state density becomes higher, the current on-off ratio tends to be lower. Also, the most favorable results were yielded for both the InP (100) wafers and the InP (111) A wafers when the Se cleansing agent was used.

Figure 13:
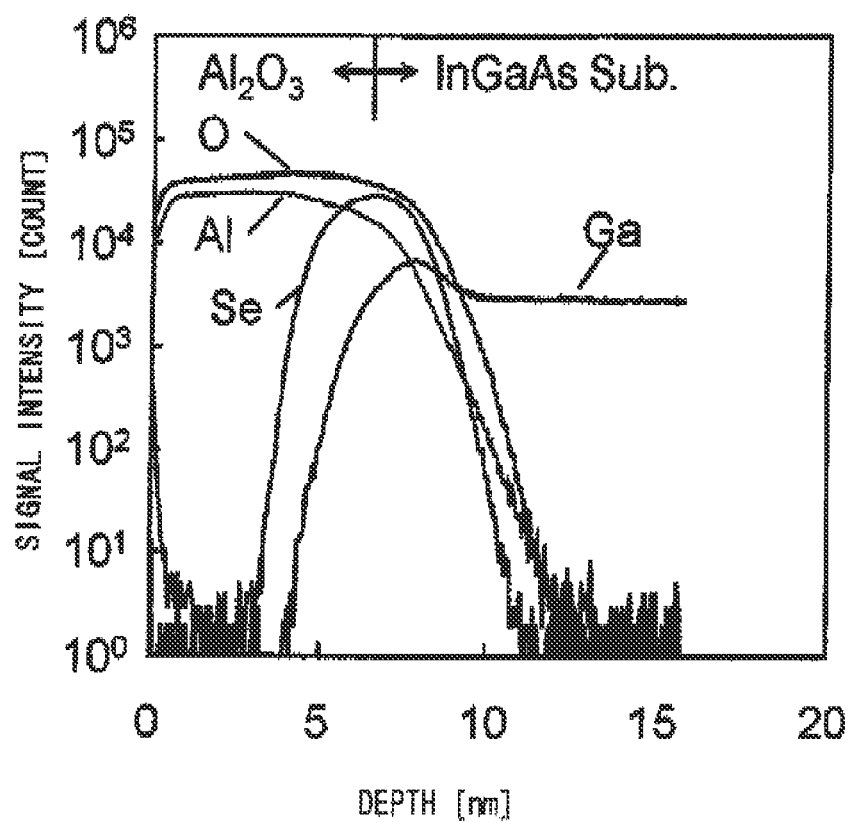
FIG. 13 shows the depth profile of an $Al_2O_3$/InGaAs layer by a secondary ion mass spectroscopy (SIMS).

FIG. 13 shows the depth profile of an $Al_2O_3$/InGaAs layer by a secondary ion mass spectroscopy (SIMS). The $Al_2O_3$/InGaAs layer was formed by forming an InGaAs layer on the InP (100) wafer, cleansing the InGaAs layer with the Se cleansing agent, and then forming an $Al_2O_3$ layer. The depth profile shown in FIG. 13 shows that Se atoms remained in the interface between the $Al_2O_3$ layer and the InGaAs layer.

Figure 14:
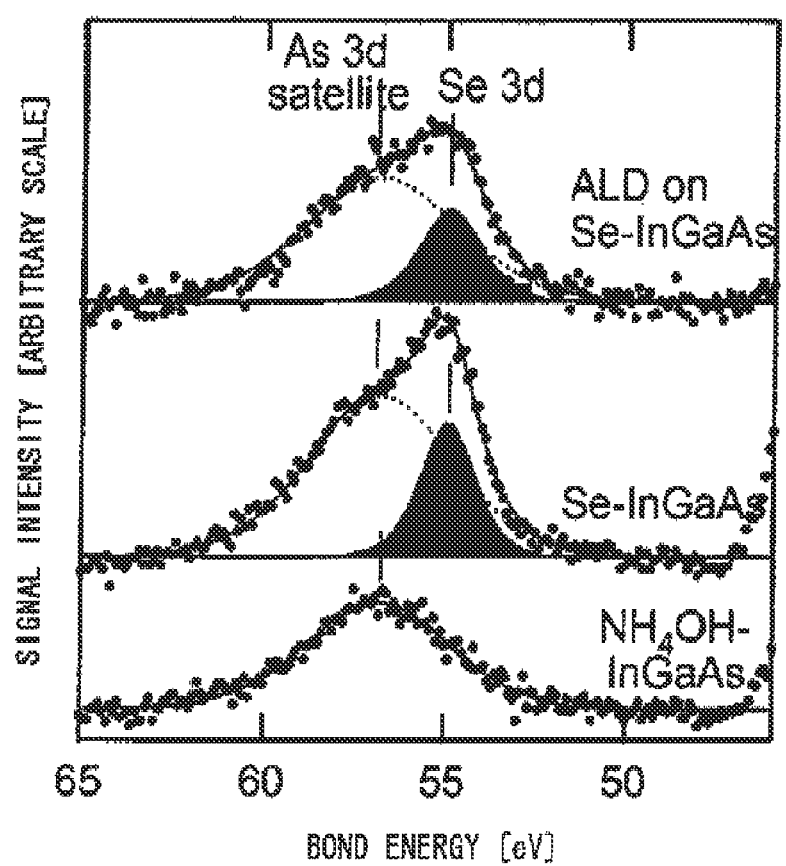
FIG. 14 shows Se3d peaks and the vicinity of the Se3d peaks obtained as a result of a surface elemental analysis by XPS for three cases that the surface of InGaAs provided on the InP wafer was processed with $NH_4OH$, that the surface of InGaAs provided on the InP wafer was processed with a Se cleansing agent, and that the surface of InGaAs provided on the InP wafer was processed with the Se cleansing agent, and then an ALD layer was formed on the InGaAs surface.
Figure 15:
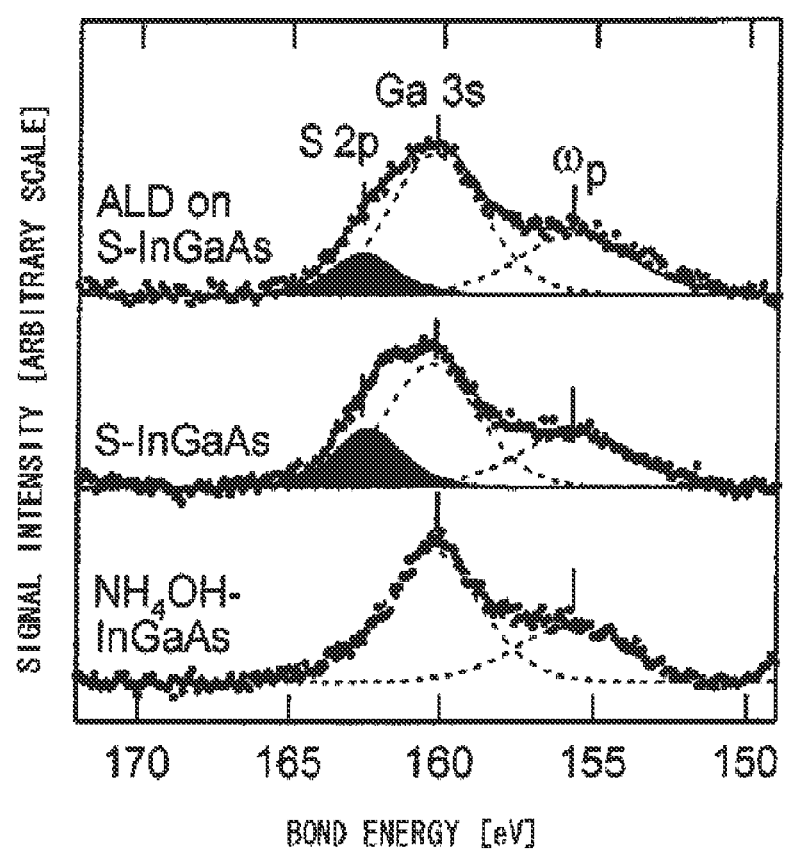
FIG. 15 shows S2p peaks and the vicinity of the S2p peaks obtained as a result of a surface elemental analysis by XPS for three cases that the surface of InGaAs provided on the InP wafer was processed with $NH_4OH$, that the surface of InGaAs provided on the InP wafer was processed with a sulfur cleansing agent, and that the surface of InGaAs provided on the InP wafer was processed with the sulfur cleansing agent, and then an ALD layer was formed on the InGaAs surface.

FIG. 14 shows Se3d peaks and the vicinity of the Se3d peaks obtained as a result of a surface elemental analysis by XPS for three cases that the surface of InGaAs provided on the InP wafer was processed with $NH_4OH$, that the surface of InGaAs provided on the InP wafer was processed with the Se cleansing agent, and that the surface of InGaAs provided on the InP wafer was processed with the Se cleansing agent, and then the ALD layer was formed on the InGaAs surface. FIG. 15 shows S2p peaks and the vicinity of the S2p peaks obtained as a result of a surface elemental analysis by XPS for three cases that the surface of InGaAs provided on the InP wafer was processed with $NH_4OH$, that the surface of InGaAs provided on the InP wafer was processed with the sulfur cleansing agent, and that the surface of InGaAs provided on the InP wafer was processed with the sulfur cleansing agent, and then the ALD layer was formed on the InGaAs surface.

The concentration of Se atoms in the interface estimated from the XPS strength of FIG. 14 corresponds to an approximately 0.2 monolayer (surface density of approximately $1 \times 10^{14}$ atoms/cm$^2$). On the other hand, the concentration of sulfur atoms in the interface estimated from the XPS strength of FIG. 15 corresponds to an approximately 0.6 monolayer. Judging from the results, the amount of Se atoms contained in the interface when the Se cleansing agent is used is estimated to be less than the amount of sulfur atoms contained in the interface when the sulfur cleansing agent is used, which is considered to be a cause of improvements in performance of the field-effect transistor produced by using the Se cleansing agent as compared with the field-effect transistor produced by using the sulfur cleansing agent.

Also, samples were created likewise by making the $H_2SeO_3$ concentration in the Se cleansing agent $1 \times 10^{-1}$ mol/l and $3 \times 10^{-1}$ mol/l, and the performance of the produced field-effect transistors was evaluated. The result of both the samples showed the performance similar to that obtained when the $H_2SeO_3$ concentration was $4\times10^{-2}$ mol/l.

According to the method for producing the semiconductor wafer of the present invention, the mobility of a field-effect transistor can be made higher and the current on-off ratio can be made higher because the MIS interface is cleansed using a Se cleansing agent.

DESCRIPTION OF REFERENCE NUMERALS

100 semiconductor wafer
102 base wafer
104 compound semiconductor layer
106 insulating layer
200 field-effect transistor
202 gate electrode
204 source electrode
206 drain electrode
208 gate metal

The invention claimed is:

1. A method for producing a semiconductor wafer, comprising:
   forming a compound semiconductor layer on a base wafer by epitaxial growth;
   cleansing a surface of the compound semiconductor later by means of a cleansing agent containing a selenium compound, and
   forming an insulating layer on the surface of the compound semiconductor later, wherein
   the molar concentration of the selenium compound in the cleansing agent falls within the range of $7\times10^{-3}$ mol/l to $7\times10^{-1}$ mol/l, such that surface density of selenium atoms contained in an interface between the compound semiconductor layer and the insulating layer is equal to or less than $1\times10^{14}$ atoms/cm$^2$.

2. The method according to claim 1 for producing a semiconductor wafer, wherein
   the selenium compound is a selenium oxide.

3. The method according to claim 2 for producing a semiconductor wafer, wherein
   the selenium oxide is $H_2SeO_3$.

4. The method according to claim 1 for producing a semiconductor wafer, wherein
   the cleansing agent further contains one or more substances selected from the group consisting of water, ammonium, and ethanol.

5. The method according to claim 1 for producing a semiconductor wafer, wherein
   the surface of the compound semiconductor layer is made of $In_xGa_{1-x}As$ ($0\leq x\leq 1$), and the insulating layer is made of $Al_2O_3$.

6. The method according to claim 1 for producing a semiconductor wafer, wherein
   forming the insulating layer is forming the insulating layer by ALD.

7. A semiconductor wafer comprising:
   a compound semiconductor layer; and
   an insulating layer that is in contact with the compound semiconductor layer, wherein
   selenium atoms are contained in an interface between the compound semiconductor layer and the insulating layer, and
   the surface density of the selenium atoms in the interface between the compound semiconductor layer and the insulating layer is equal to or less than $1\times10^{14}$ atoms/cm$^2$.

8. The semiconductor wafer according to claim 7, wherein
   the surface of the compound semiconductor layer is made of $In_xGa_{1-x}As$ ($0\leq x\leq 1$), and the insulating layer is made of $Al_2O_3$.

* * * * *